US012810904B2

(12) United States Patent
Lee et al.

(10) Patent No.: US 12,810,904 B2

(45) Date of Patent: Nov. 24, 2026

(54) METHODS FOR DIRECT WORDLINE CONTACT FORMATION FOR NAND DEVICES

(71) Applicant: Applied Materials, Inc., Santa Clara, CA (US)

(72) Inventors: HsiangYu Lee, Cupertino, CA (US); Pradeep Subrahmanyan, Cupertino, CA (US); Changwoo Sun, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 138 days.

(21) Appl. No.: 18/525,198

(22) Filed: Nov. 30, 2023

(65) Prior Publication Data

US 2024/0185893 A1 Jun. 6, 2024

Related U.S. Application Data

(60) Provisional application No. 63/429,856, filed on Dec. 2, 2022.

(51) Int. Cl.

*G11C 5/06* (2006.01)
*H10B 41/10* (2023.01)

(Continued)

(52) U.S. Cl.

CPC ............. *G11C 5/063* (2013.01); *H10B 41/10* (2023.02); *H10B 41/20* (2023.02); *H10B 41/35* (2023.02);

(Continued)

(58) Field of Classification Search

CPC ........ G11C 5/063; H10B 41/10; H10B 41/20; H10B 41/35; H10B 43/10; H10B 43/20;

(Continued)

(56) References Cited

U.S. PATENT DOCUMENTS 6,410,948 B1 * 6/2002 Tran ...................... H10B 12/31 257/260
7,339,222 B1 * 3/2008 Ding ...................... H10B 69/00 257/311

(Continued)

FOREIGN PATENT DOCUMENTS

| | | |
|---|---|---|
| TW | 201417188 A | 5/2014 |
| TW | 202212605 A | 4/2022 |
| TW | 202224095 A | 6/2022 |

OTHER PUBLICATIONS

International Search Report and Written Opinion of the International Searching Authority issued in International Application No. PCT/US2023/081902, mailed Apr. 2, 2024, 12 pages.

*Primary Examiner* — Caleb E Henry

(74) *Attorney, Agent, or Firm* — KDW Firm PLLC

(57) ABSTRACT

Disclosed are approaches for direct wordline contact formation for 3D NAND devices. One method may include providing a first film stack comprising a first plurality of alternating first layers and second layers, and forming a first plurality of contact openings in the first film stack, wherein each contact opening is formed to a different etch depth. The method may further include forming a sacrificial gapfill within the first plurality of contact openings, and forming a second film stack atop the first film stack, wherein the second film stack comprises a second plurality of alternating first layers and second layers. The method may further include forming a second plurality of contact openings in the second film stack, wherein a first set of contact openings of the second plurality of contact openings extends to the sacrificial gapfill, and removing the sacrificial gapfill from the first plurality of contact openings.

16 Claims, 12 Drawing Sheets

(51) Int. Cl.
*H10B 41/20* (2023.01)
*H10B 41/35* (2023.01)
*H10B 43/10* (2023.01)
*H10B 43/20* (2023.01)
*H10B 43/35* (2023.01)

(52) U.S. Cl.
CPC ............. *H10B 43/10* (2023.02); *H10B 43/20* (2023.02); *H10B 43/35* (2023.02)

(58) Field of Classification Search
CPC ........ H10B 43/35; H10B 41/50; H10B 43/27; H10B 43/50
See application file for complete search history.

(56) References Cited

U.S. PATENT DOCUMENTS

| | | | | |
|---|---|---|---|---|
| 8,404,578 | B2* | 3/2013 | Kim | H10B 43/30 438/599 |
| 8,754,463 | B2* | 6/2014 | Fastow | H10B 69/00 257/314 |
| 9,653,311 | B1* | 5/2017 | Ahn | H01J 37/32577 |
| 10,727,245 | B2* | 7/2020 | Xu | H10B 43/20 |
| 11,075,215 | B2* | 7/2021 | Howder | H10B 41/35 |
| 11,329,062 | B2* | 5/2022 | Dorhout | H10B 41/10 |
| 11,844,222 | B2* | 12/2023 | Takuma | H10B 41/10 |
| 12,408,345 | B2* | 9/2025 | Takuma | H10B 41/10 |
| 12,457,749 | B2* | 10/2025 | Tobioka | H10B 41/10 |
| 2006/0211255 | A1* | 9/2006 | Huang | H10B 41/40 257/E27.081 |
| 2009/0125371 | A1* | 5/2009 | Neylon | G06F 16/313 707/739 |
| 2010/0013049 | A1 | 1/2010 | Tanaka | |
| 2015/0004796 | A1* | 1/2015 | Kim | H10P 76/204 438/719 |
| 2015/0011027 | A1* | 1/2015 | Lian | H10P 74/238 438/16 |
| 2015/0084203 | A1 | 3/2015 | Chen | |
| 2016/0104715 | A1 | 4/2016 | Pachamuthu | |
| 2017/0062469 | A1* | 3/2017 | Tsiang | H10B 43/27 |
| 2017/0352586 | A1* | 12/2017 | Venkatasubramanian | H10P 14/68 |
| 2018/0366482 | A1 | 12/2018 | Zhou | |
| 2019/0081059 | A1* | 3/2019 | Xu | H10B 43/10 |
| 2019/0206884 | A1* | 7/2019 | Ng | H10B 41/27 |
| 2020/0144283 | A1* | 5/2020 | Kim | H10B 43/27 |
| 2020/0168624 | A1* | 5/2020 | Howder | H10D 64/037 |
| 2020/0235122 | A1* | 7/2020 | Kang | H10B 43/27 |
| 2020/0251151 | A1* | 8/2020 | Kang | H10B 12/03 |
| 2020/0251347 | A1* | 8/2020 | Hopkins | H10P 50/283 |
| 2020/0266203 | A1* | 8/2020 | Bhushan | G11C 16/0466 |
| 2020/0279855 | A1* | 9/2020 | Tran | H10B 41/27 |
| 2020/0312863 | A1* | 10/2020 | Iwai | H10B 43/10 |
| 2020/0312864 | A1* | 10/2020 | Iwai | H10B 41/27 |
| 2020/0312874 | A1* | 10/2020 | Kang | H10B 43/27 |
| 2020/0328222 | A1* | 10/2020 | Barclay | H10B 41/27 |
| 2020/0373310 | A1* | 11/2020 | Koshizawa | H10B 41/50 |
| 2020/0373316 | A1* | 11/2020 | Luo | G11C 16/0483 |
| 2020/0373322 | A1* | 11/2020 | Surthi | H10B 41/35 |
| 2021/0040607 | A1* | 2/2021 | Han | C23C 16/345 |
| 2021/0111258 | A1* | 4/2021 | Fulford | H10B 43/27 |
| 2021/0143058 | A1* | 5/2021 | Jha | H10P 14/412 |
| 2021/0210498 | A1* | 7/2021 | Leobandung | G11C 16/24 |
| 2021/0233779 | A1* | 7/2021 | Kang | H10P 95/00 |
| 2021/0343624 | A1* | 11/2021 | Chary | H10B 41/10 |
| 2021/0399011 | A1* | 12/2021 | Kang | H10B 43/27 |
| 2022/0005818 | A1 | 1/2022 | Tanaka | |
| 2022/0059555 | A1* | 2/2022 | Kang | G11C 8/14 |
| 2022/0157841 | A1 | 5/2022 | Tsutsumi | |
| 2022/0208556 | A1* | 6/2022 | Tirukkonda | H10P 50/73 |
| 2022/0208776 | A1* | 6/2022 | Titus | H10B 43/35 |
| 2022/0208785 | A1* | 6/2022 | Titus | H10B 41/10 |
| 2022/0208788 | A1* | 6/2022 | Okamoto | H10B 41/10 |
| 2022/0216048 | A1* | 7/2022 | Li | H10P 14/662 |
| 2022/0223614 | A1* | 7/2022 | Takuma | H10B 41/10 |
| 2022/0319601 | A1* | 10/2022 | Kang | H10B 43/27 |
| 2022/0352182 | A1* | 11/2022 | Saeedi Vahdat | H10B 43/27 |
| 2022/0367487 | A1 | 11/2022 | Zhang | |
| 2022/0367499 | A1 | 11/2022 | Matsuno | |
| 2022/0367560 | A1* | 11/2022 | Kang | H10B 43/27 |
| 2022/0384479 | A1 | 12/2022 | Song | |
| 2022/0406646 | A1* | 12/2022 | Mangu | H10D 64/035 |
| 2024/0099014 | A1* | 3/2024 | Takuma | H10B 41/10 |
| 2024/0292628 | A1* | 8/2024 | Tobioka | H10B 41/10 |
| 2024/0315040 | A1* | 9/2024 | Tobioka | H10B 43/50 |

* cited by examiner

METHODS FOR DIRECT WORDLINE CONTACT FORMATION FOR NAND DEVICES

RELATED APPLICATION

This application claims priority to U.S. provisional patent application Ser. No. 63/429,856, filed on Dec. 2, 2022, entitled "Wordline Contact Formation for NAND Device," which is incorporated herein by reference in its entirety.

FIELD

The present embodiments relate to processing of NAND devices and, more particularly, to approaches for direct wordline contact formation for 3D NAND devices.

BACKGROUND

In accordance with current substrate (e.g., wafer) manufacturing approaches, etch speed, etch profile, and etch selectivity are optimized to lower manufacturing cost and increase circuit element density on a substrate. Etch features, such as memory holes, continue to shrink in size and/or increase in aspect ratio (e.g., ratio of depth to width of a feature), however. For example, in three dimensional (3D) NAND device manufacturing, substrates can include up to 96 layers and can extend up to 128 layers. Additionally, an aspect ratio of a memory hole, for example, can be between 100 to 200 with a memory hole depth ranging from about 6 μm to 8 μm, thus making memory hole etching one of the most critical and challenging steps when manufacturing 3D NAND devices. For example, such high aspect ratio etching not only requires high etching speed and high etching selectivity, e.g., to mask material on a substrate, but it also requires a straight profile without bowing and twisting, no under-etch and minimum micro-loading, minimum aspect ratio dependent etching (ARDE), and uniformity across the entire substrate (e.g., critical dimension (CD) variation of $3\sigma<1\%$).

When manufacturing 3D NAND devices having a staircase arrangement of layers, wordline landing pad formation is defined first through staircase formation (e.g., lithography and etch steps) and/or a chop process in which multiple layers are etched down, followed by a staircase area gap fill. However, selectivity margin during wordline contact etching remains a challenge, as contact holes with different height are formed in a same etch step. Furthermore, using higher dry etch-process temperatures to increase selectivity is constrained by hardware limits.

It is with respect to these and other considerations that the present disclosure is provided.

SUMMARY OF THE DISCLOSURE

In view of the foregoing, a method may include providing a first film stack comprising a first plurality of alternating first layers and second layers, and forming a first plurality of contact openings in the first film stack, wherein each contact opening of the first plurality of contact openings is formed to a different etch depth relative to an upper surface of the first film stack. The method may further include forming a sacrificial gapfill within the first plurality of contact openings, and forming a second film stack atop the upper surface of the first film stack, wherein the second film stack comprises a second plurality of alternating first layers and second layers. The method may further include forming a second plurality of contact openings in the second film stack, wherein a first set of contact openings of the second plurality of contact openings extends to the sacrificial gapfill, and removing the sacrificial gapfill from the first plurality of contact openings.

In some approaches, a system may include a processor, and a memory storing instructions executable by the processor to provide a first film stack comprising a first plurality of alternating first layers and second layers, and to form a first plurality of contact openings in the first film stack, wherein each contact opening of the first plurality of contact openings is formed to a different etch depth relative to an upper surface of the first film stack. The memory may further store instructions operable by the processor to form a sacrificial gapfill within the first plurality of contact openings, and to form a second film stack atop the upper surface of the first film stack, wherein the second film stack comprises a second plurality of alternating first layers and second layers. The memory may further store instructions operable by the processor to form a second plurality of contact openings in the second film stack, wherein a first set of contact openings of the second plurality of contact openings extends to the sacrificial gapfill, and to remove the sacrificial gapfill from the first plurality of contact openings.

In some approaches, a memory device may include a stack of layers comprising a first film stack and a second film stack, wherein the stack of layers includes a plurality of alternating first layers and wordlines oriented horizontally, and a first plurality of contact openings and a second plurality of contact openings formed vertically through the first film stack and the second film stack, wherein each contact opening of the first and second plurality of contact openings extends to an upper surface of the stack of layers, and wherein each contact opening of the plurality of contact openings is formed to a different etch depth relative to the upper surface of the stack of layers. The memory device may further include a wordline contact formed within each contact opening of the plurality of contact openings.

BRIEF DESCRIPTION OF THE DRAWINGS

The accompanying drawings illustrate exemplary approaches of the disclosure, including the practical application of the principles thereof, as follows.

Figure 1:
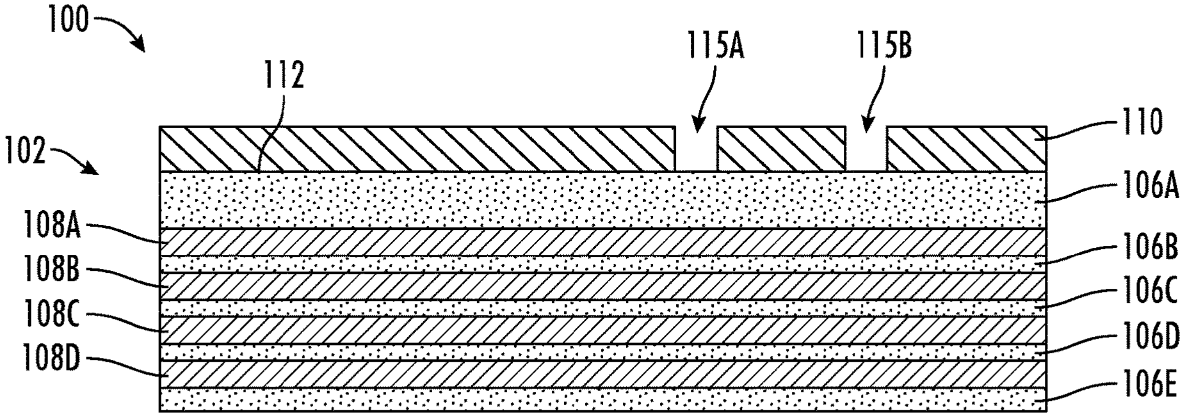
FIG. 1 illustrates a side cross-sectional view of a patterned first masking layer over a stack of alternating first and second layers of an exemplary device, according to embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods, systems, and devices in accordance with the present disclosure will now be described more fully hereinafter with reference to the accompanying drawings, where various embodiments are shown. The methods, systems, and devices may be embodied in many different forms and are not to be construed as being limited to the embodiments set forth herein. Instead, these embodiments are provided so the disclosure will be thorough and complete, and will fully convey the scope of the methods to those skilled in the art.

Embodiments described herein are directed to 3D NAND wordline contact-first approaches with higher feasibility to integrate with other high-aspect ratio modules together (e.g., slit and CMOS contact). Direct wordline contact techniques of the present disclosure can reduce multiple conventional processing steps (e.g., staircase formation lithography and etching, chop lithography and etching, staircase area gapfill deposition and planarization), and thus provides significant throughput and cost benefits. Furthermore, by forming wordline contact openings before wordline metal deposition, contact metal selectivity is improved and the use of stop layers and wordline landing pads may be eliminated. Still furthermore, the approaches of the present disclosure allow a larger CD at a lower tier of the device, which can increase contact landing margin and relax the burden of lithography alignment error.

FIG. 1 illustrates a side cross-sectional view of a memory device (hereinafter "device") 100 at an early stage of processing, according to one or more embodiments described herein. The device 100 may include a first film stack 102 having a plurality of alternating horizontal first layers 106A-106E and second layers 108A-108D stacked atop one another. The first film stack 102 may be a part of a memory cell device, such as a three-dimensional (3D) memory device (e.g., NAND). Although non-limiting, the first layers 106A-106E may be a dielectric material, such as silicon oxide (SiO), and the second layers 108A-108D may be a second dielectric material, such as silicon nitride. In other embodiments, suitable dielectric materials for the first layers 106A-106E and/or the second layers 108A-108D may include silicon oxynitride, silicon carbide, silicon oxycarbide, titanium nitride, composite of oxide and nitride, at least one or more oxide layers sandwiching a nitride layer, and combinations thereof, among others.

As further shown, the device 100 may include a first masking layer 110 formed directly atop an upper surface 112 of the first film stack 102. The first masking layer 110 may be a photoresist layer including a set (i.e., one or more) of first mask openings 115A, 115B formed (e.g., etched) therein. As shown, the first mask openings 115A, 115B may be formed selective to the upper surface 112 of the first film stack 102.

Figure 2:
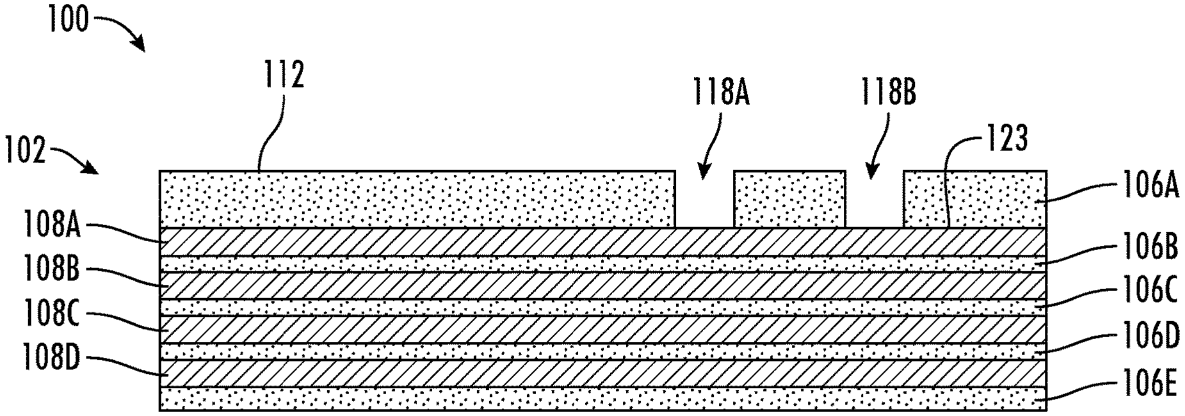
FIG. 2 illustrates a side cross-sectional view of a first set of contact openings formed in the stack of alternating first and second layers of the exemplary device, according to embodiments of the present disclosure.

FIG. 2 demonstrates a set of first contact holes or openings 118A, 118B formed through a top layer of the first film stack 102. In the embodiment shown, the first contact openings 118A, 118B are formed through the uppermost first layer 106A, which is exposed within the first mask openings 115A, 115B of the first masking layer 110. The first contact openings 118A, 118B may be etched selective to an upper surface 123 of second layer 108A.

Figure 3:
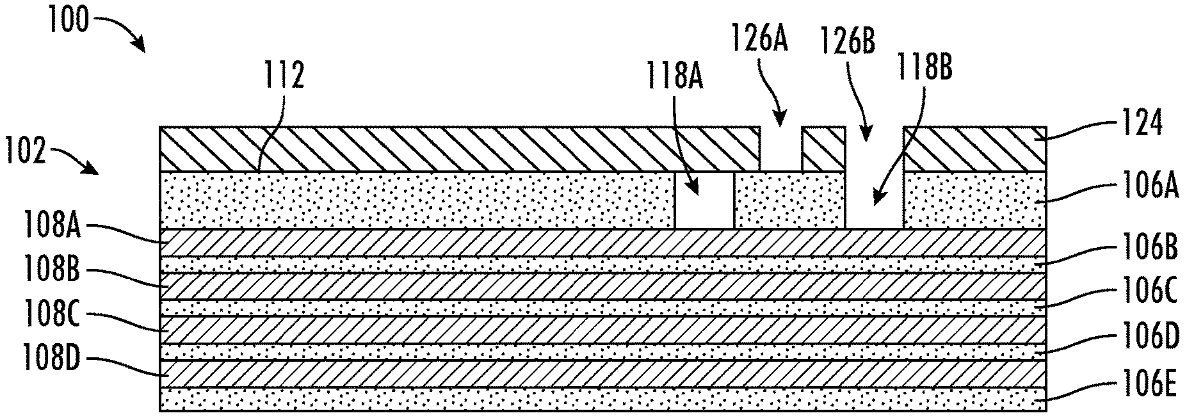
FIG. 3 illustrates a side cross-sectional view of a patterned second masking layer over the stack of alternating first and second layers of the exemplary device, according to embodiments of the present disclosure.

As demonstrated in FIG. 3, a second masking layer 124 may then be formed over the first film stack 102 and etched to form a set of second mask openings 126A, 126B therein. As shown, the second masking layer 124 may cover the first contact opening 118A, while the second mask opening 126B may be aligned with first contact opening 118B. The mask opening 126A may be formed between the first contact openings 118A, 118B.

Figure 4:
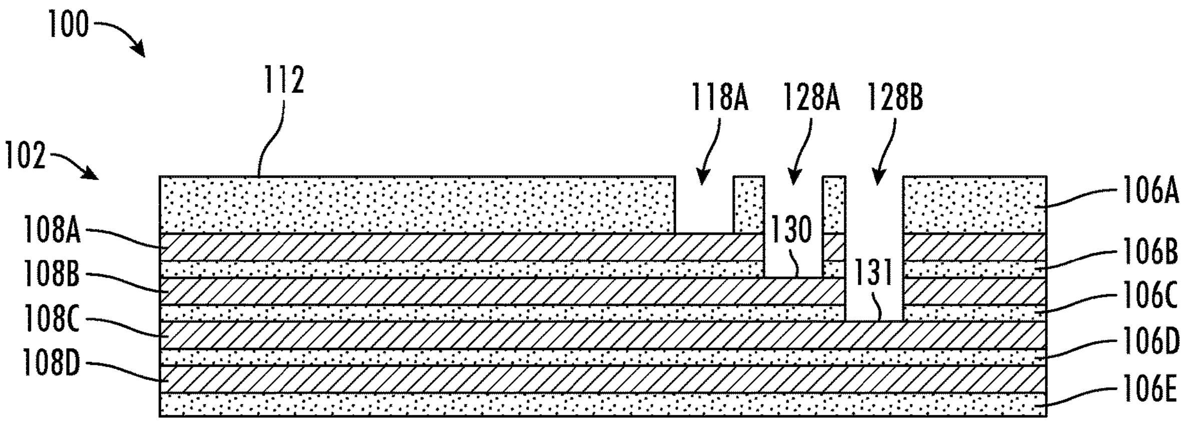
FIG. 4 illustrates a side cross-sectional view of a second set of contact openings formed in the stack of alternating first and second layers of the exemplary device, according to embodiments of the present disclosure.

As demonstrated in FIG. 4, the first film stack 102 may again be etched to form a set of third contact openings 128A, 128B. The etch may be performed to the device 100 while the second masking layer 124 is present, which is subsequently removed. As such, the first contact opening 118A is generally unaffected by this etch step. The third contact opening 128A is formed through the first layer 106A, the second layer 108A, and the first layer 106B. The third contact opening 128A may extend to, and expose, an upper surface 130 of the second layer 108B. Meanwhile, the third contact opening 128B is formed through the first layer 106A, the second layer 108A, the first layer 106B, the second layer 108B, and the first layer 106C. The third contact opening 128B may extend to, and expose, an upper surface 131 of the second layer 108C. As demonstrated, the first contact opening 118A and the third contact openings 128A and 128B extend to different depths relative to the upper surface 112 of the first film stack 102.

Figure 5:
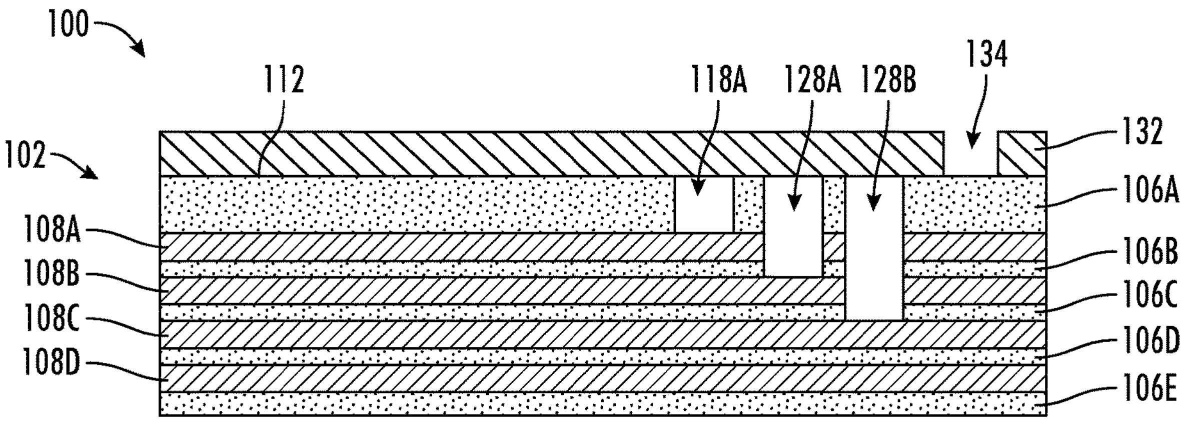
FIG. 5 illustrates a side cross-sectional view of a patterned third masking layer over the stack of alternating first and second layers of the exemplary device, according to embodiments of the present disclosure.

As demonstrated in FIG. 5, a third masking layer 132 may then be formed over the first film stack 102 and etched to form a third mask opening 134 therein. As shown, the third masking layer 132 may cover the first contact opening 118A and the third contact openings 128A, 128B. The third mask opening 134 may be formed selective to the upper surface 112 of the first film stack 102.

Figure 6:
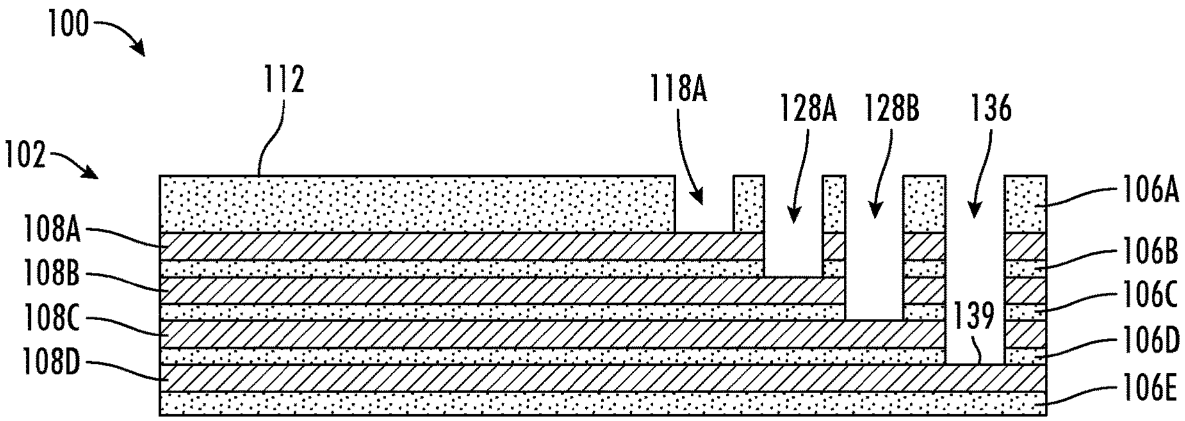
FIG. 6 illustrates a side cross-sectional view of a third set of contact openings formed in the stack of alternating first and second layers of the exemplary device, according to embodiments of the present disclosure.

As demonstrated in FIG. 6, the first film stack 102 may again be etched to form a fourth contact opening 136. The etch may be performed to the device 100 while the third masking layer 132 is present, which is then removed. As such, the first contact opening 118A and the third contact openings 128A, 128B are generally unaffected during formation of the fourth contact opening 136. The fourth contact opening 136 is formed through first layers 106A 106D and through second layers 108A-108C. The fourth contact opening 136 may extend to, and expose, an upper surface 139 of the second layer 108D. As demonstrated, the first contact opening 118A, the third contact opening 128A, the third contact opening 128B, and the fourth contact opening 136 extend to different depths relative to the upper surface 112 of the first film stack 102. The masking and etch steps may repeat depending on the number of layers present in the first film stack 102. It will be appreciated that the device 100 may include a greater number of layers in other examples.

Figure 7:
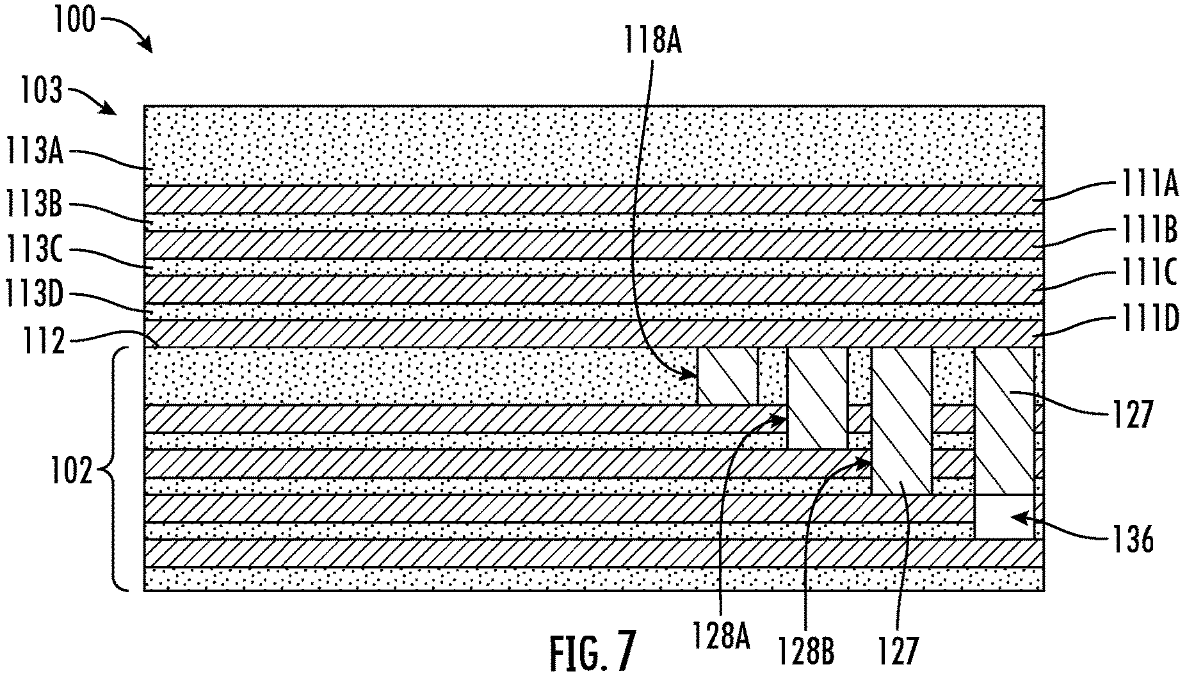
FIG. 7 illustrates a side cross-sectional view of the exemplary device following formation of a sacrificial gapfill within the contact openings and formation of a second stack of alternating first and second layers, according to embodiments of the present disclosure.

As demonstrated in FIG. 7, a sacrificial gapfill 127 may be formed within the first contact opening 118A, the third contact opening 128A, the third contact opening 128B, and the fourth contact opening 136 of the first film stack 102. In some embodiments, the sacrificial gapfill 127 may be deposited over the first film stack 102 and then planarized selective to the upper surface 112. A second film stack 103 may then be formed atop the first film stack 102, including over the sacrificial gapfill 127. As shown, the second film stack 103 may include a second plurality of alternating first layers 113A-113D and second layers 111A-111D arranged horizontally. Although non-limiting, the first layers 113A-113D may be a dielectric material, such as silicon oxide (SiO), and the second layers 111A-111D may be a second dielectric material, such as silicon nitride. In other embodiments, suitable dielectric materials for the first layers 113A-113D and/or the second layers 111A-111D may include silicon oxynitride, silicon carbide, silicon oxycarbide, titanium nitride, composite of oxide and nitride, at least one or more oxide layers sandwiching a nitride layer, and combinations thereof, among others.

Figure 8:
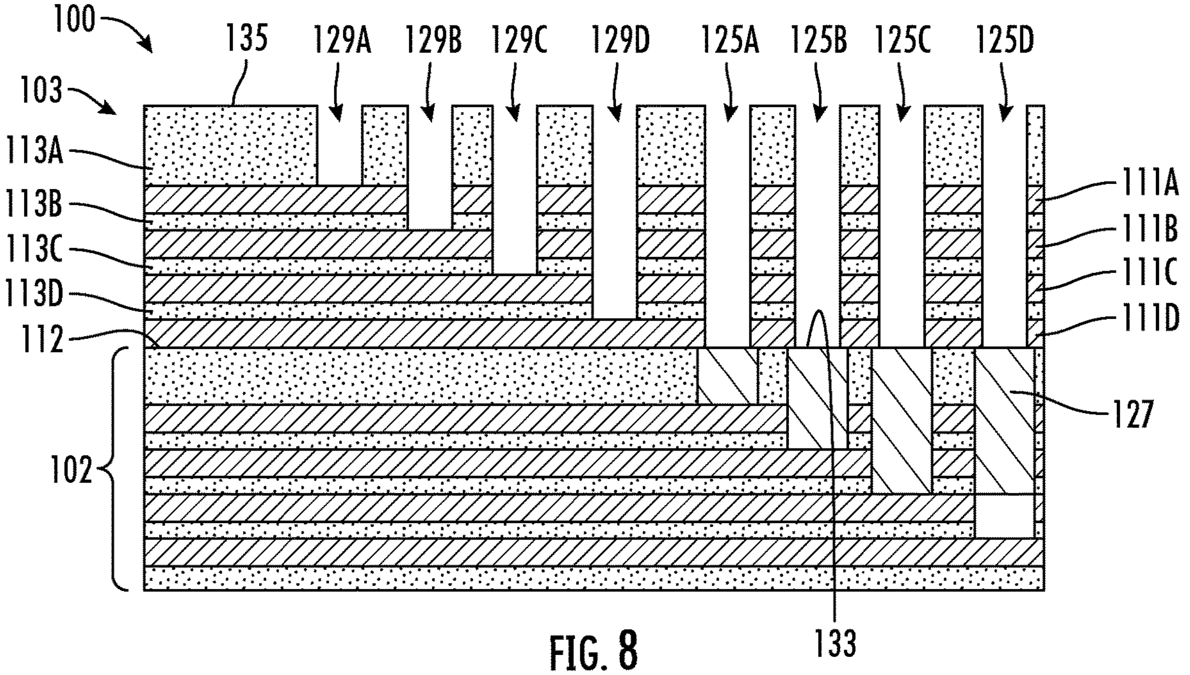
FIG. 8 illustrates a side cross-sectional view of the exemplary device following formation of a plurality of contact openings through the second stack of alternating first and second layers, according to embodiments of the present disclosure.

As demonstrated in FIG. 8, a first set of contact openings 125A-125D and a second set of contact openings 129A-129D may be formed in the second film stack 103. Although not shown, a plurality of masking and lithography steps may be used to form the first set of contact openings 125A-125D and the second set of contact openings 129A-129D. As shown, the first set of contact openings 125A-125D may be aligned with, and extend to, an upper surface 133 of the sacrificial gapfill 127. The second set of contact openings 129A-129D may each extend to different depths relative to an upper surface 135 of the second film stack 103. For example, contact opening 129A may extend to second layer 111A, contact opening 129B may extend to second layer 111B, contact opening 129C may extend to second layer 111C, and contact opening 129D may extend to second layer 111D.

Figure 9:
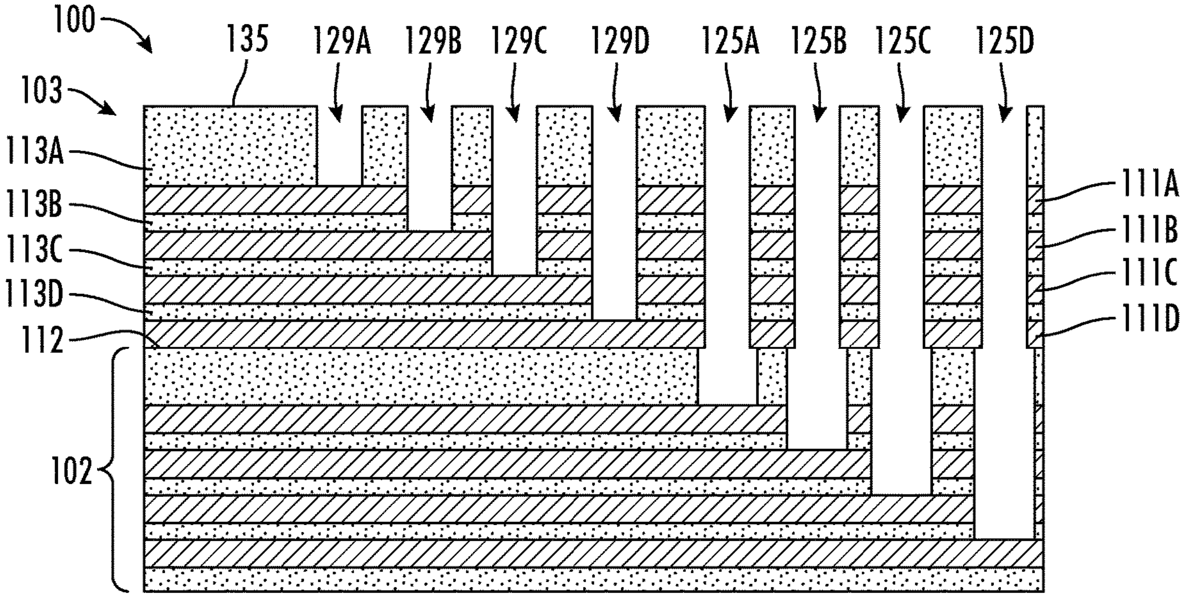
FIG. 9 illustrates a side cross-sectional view of the exemplary device following removal of the sacrificial gapfill, according to embodiments of the present disclosure.
Figure 10:
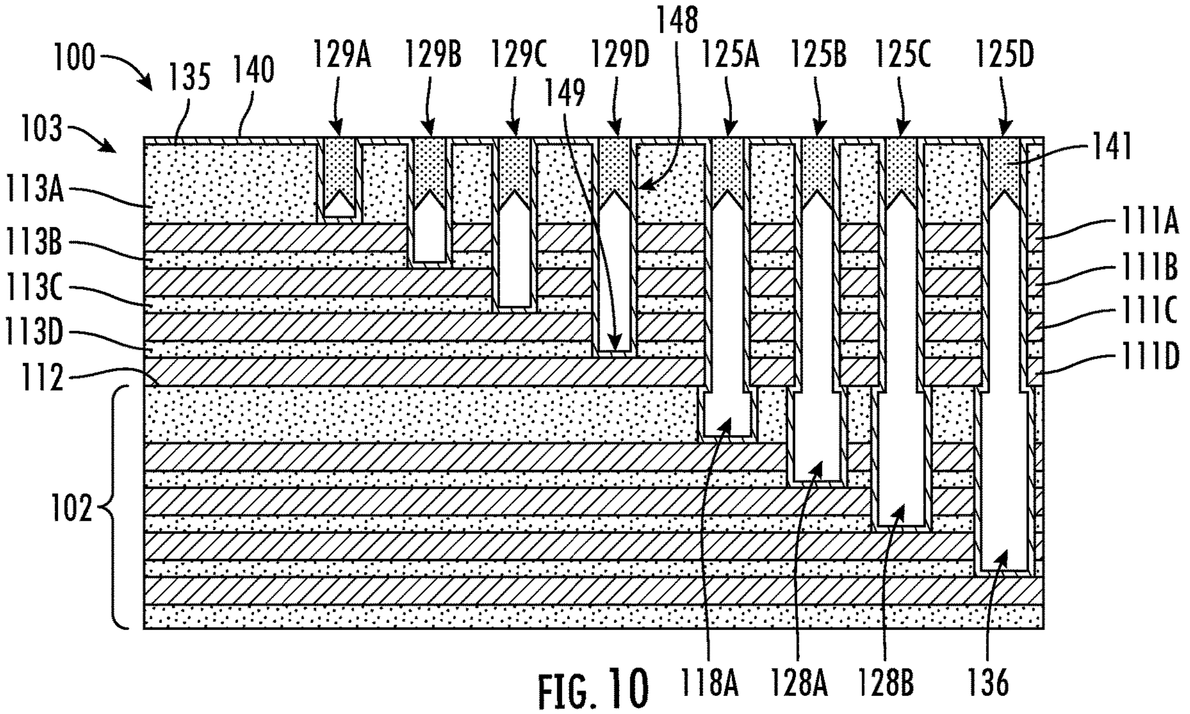
FIG. 10 illustrates a liner formed within the plurality of contact openings, according to embodiments of the present disclosure.

The sacrificial gapfill 127 may then be removed, as shown in FIG. 9, and a liner 140 may then be formed over the device 100, including within each of the first set of contact openings 125A-125D and the second set of contact openings 129A-129D (hereinafter also referred to collectively as the second plurality of contact openings), as shown in FIG. 10. The liner 140 may also be formed within each of the first contact opening 118A, the third contact opening 128A, the third contact opening 128B, and the fourth contact opening 136 (hereinafter also referred to collectively as the first plurality of contact openings) of the first film stack 102. In some embodiments, the liner 140 may be an oxide layer (e.g., SiO, AlO, etc.), which is formed (e.g., via atomic layer deposition (ALD)) along the upper surface 135 of the second film stack 103, and along a sidewall 148 and bottom 149 of the first and second plurality of contact openings. As further shown, a gapfill 141 may be formed within each of the first and second plurality of contact openings.

Figure 11:
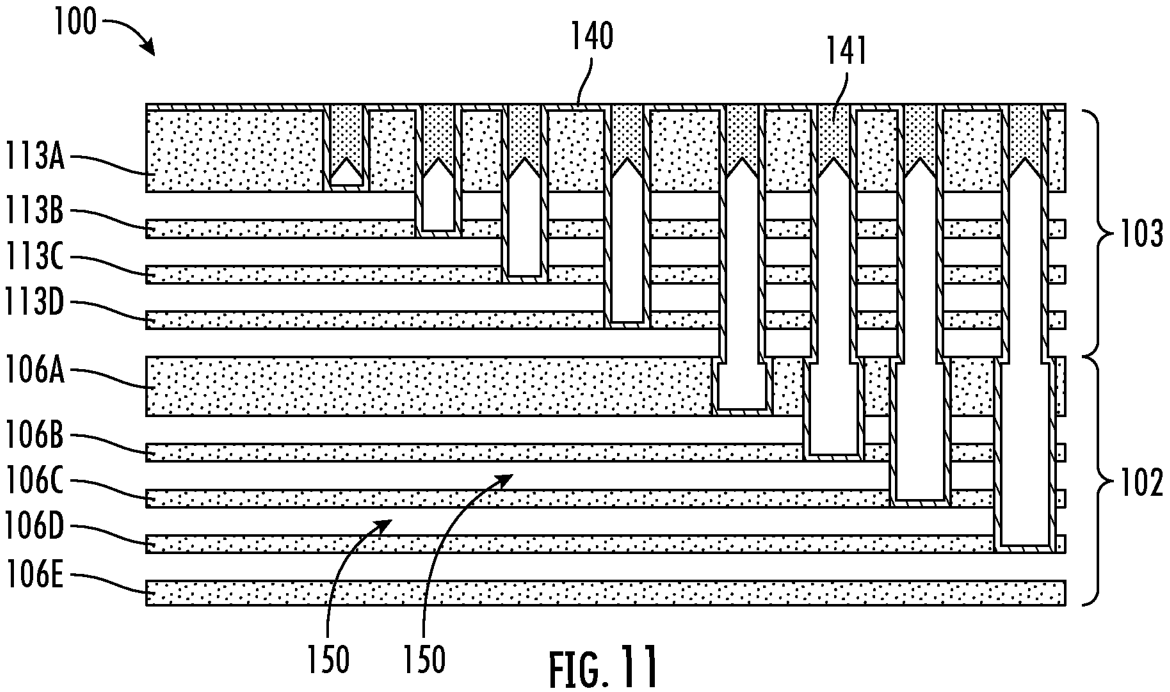
FIG. 11 illustrates a side cross-sectional view of the exemplary device following removal of the second layers, according to embodiments of the present disclosure.

As demonstrated in FIG. 11, the second layers 108A-108D of the first film stack 102 and the second layers 111A-111D of the second film stack 103 have been removed, e.g., by a horizontal wet etch process, to form a plurality of wordline openings 150 in the device 100. The first layers 106A-106E of the first film stack 102 and the first layers 113A-113D of the second film stack are generally unaffected by the wet etch, as is the liner 140, which remains within the first and second plurality of contact openings.

Figure 12:
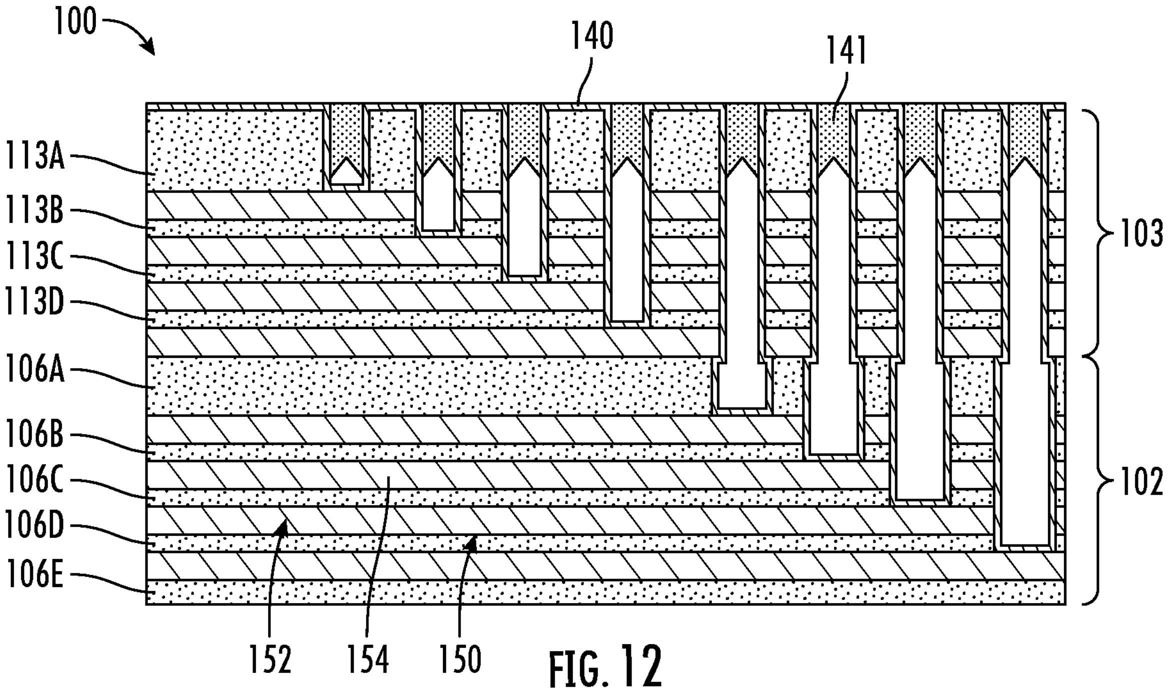
FIG. 12 illustrates a side cross-sectional view of the exemplary device following formation of a plurality of wordlines, according to embodiments of the present disclosure.
Figure 13:
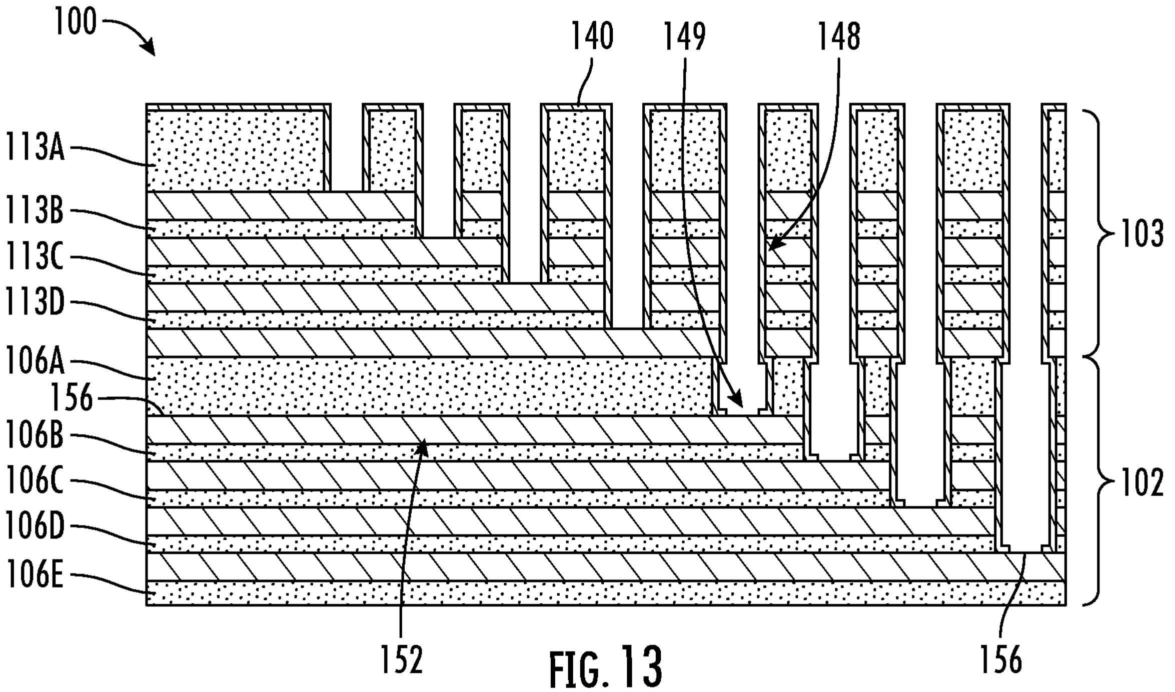
FIG. 13 illustrates a side cross-sectional view of the exemplary device after the liner is removed from a bottom of each of the plurality of contact openings, according to embodiments of the present disclosure.

A plurality of wordlines 152 may then be formed in the device 100, as demonstrated in FIG. 12, by depositing a first conductive material 154 (e.g., tungsten (W) or molybdenum (Mo)) within the plurality of wordline openings 150. The gapfill 141 and the liner 140 may then be removed, as shown in FIG. 13, wherein the liner 140 is removed from the bottom 149 of the first and second plurality of contact openings. In some embodiments, the liner 140 may be vertically etched to expose an upper surface 156 of one or more of the plurality of wordlines 152. As shown, the liner 140 remains along the sidewall 148 of the first and second plurality of contact openings. In some embodiments, the liner 140 is also removed from the upper surface 135 of the second film stack 103.

Figure 14:
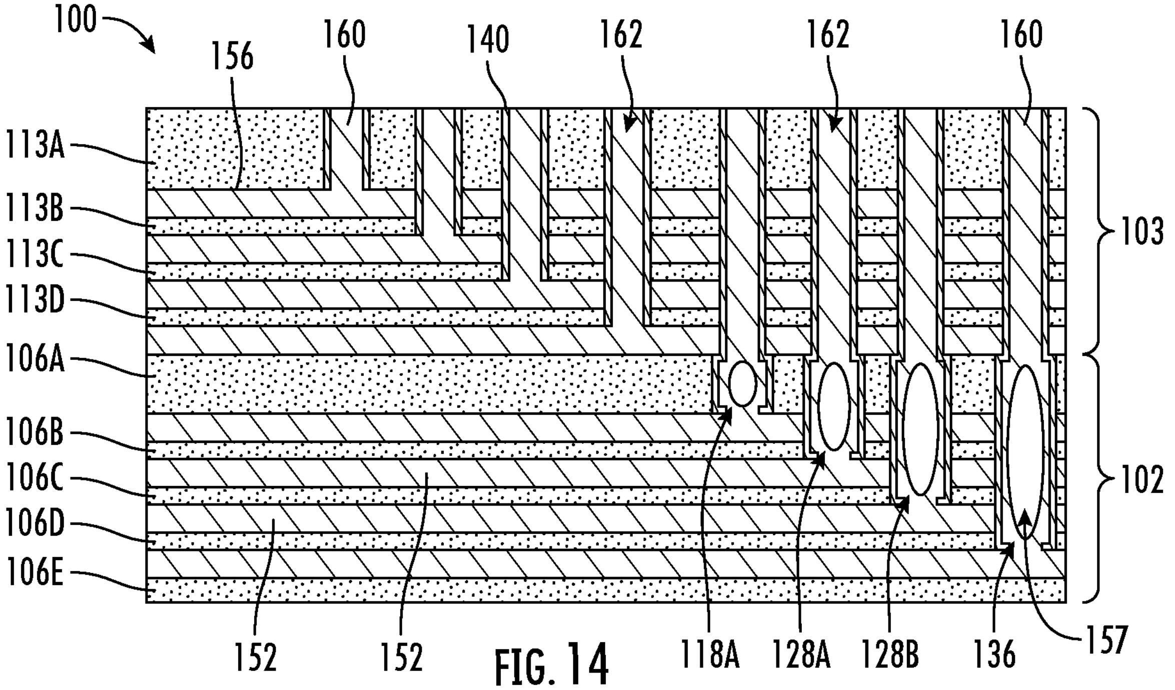
FIG. 14 illustrates a side cross-sectional view of the exemplary device after formation of a plurality of wordline contacts, according to embodiments of the present disclosure.

As demonstrated in FIG. 14, a second conductive material 160 may be deposited within the first and second plurality of contact openings to form a plurality of wordline contacts 162. In some embodiments, the second conductive material 160 may be tungsten, which is deposited, e.g., via atomic layer deposition, together with titanium nitride (TiN), atop the upper surface 156 of the plurality of wordlines 152. The second conductive material 160 may be separated from the first layers 106A-106E and the first layers 113A-113D by the liner 140 along the sidewall 148 of the first and second plurality of contact openings. In some embodiments, a void 157 in the conductive material 160 may be present in the first contact opening 118A, the third contact opening 128A, the third contact opening 128B, and the fourth contact opening 136 of the first film stack 102 due to the aspect ratio of these contact openings.

Figure 15A:
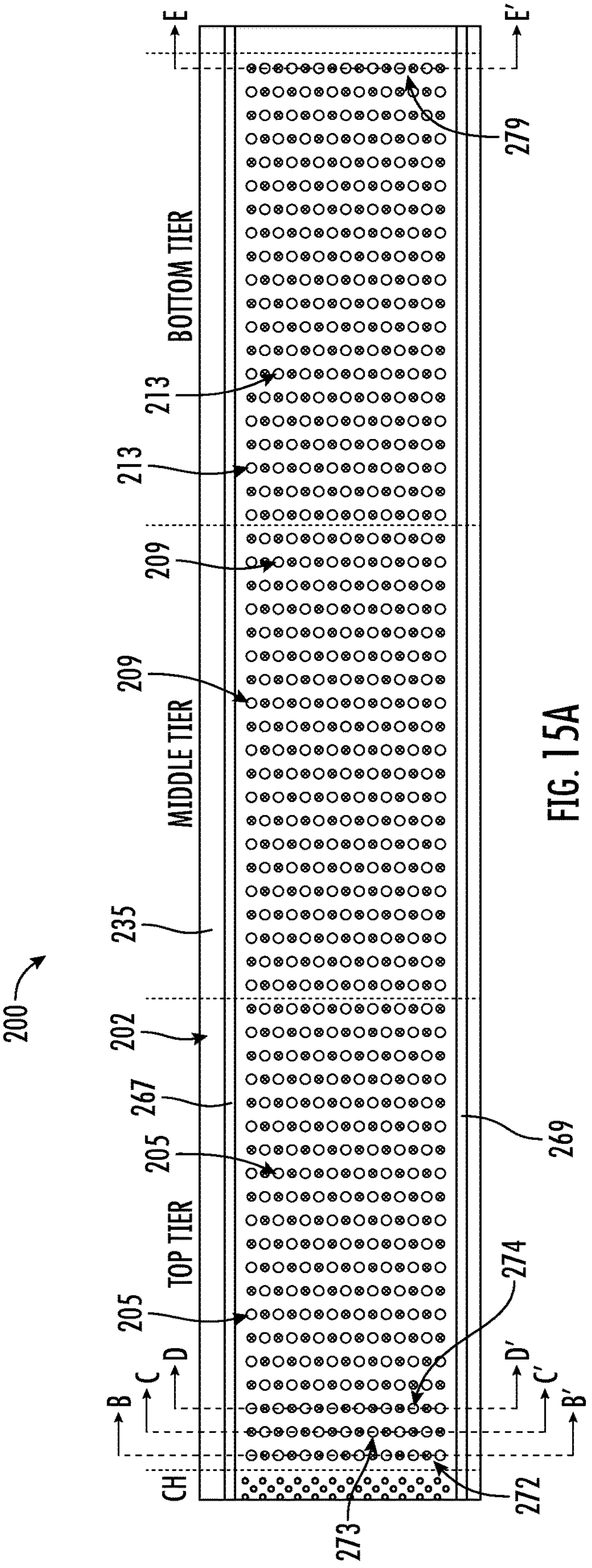
FIG. 15A illustrates a top view of a NAND device including a plurality of tiers of contacts formed therein, according to embodiments of the present disclosure.

FIG. 15A is a top view of a device 200 including a plurality of tiers of wordline contacts formed in a plurality of film stacks 202. For example, a top tier may include a first plurality of wordline contacts 205, a middle tier may include a second plurality of wordline contacts 209, and a bottom tier may include a third plurality of wordline contacts 213. Although not shown, it will be appreciated that additional tiers may be possible in alternative embodiments. Each of the first, second, and third plurality of wordline contacts 205, 209, and 213 may be formed using the approaches shown in FIGS. 1-14 and described above. For example, the top tier may correspond to the wordline contacts 162 formed in the second set of contact openings 129A-129D of the second film stack 103, while the middle and/or bottom tier may correspond to the wordline contacts 162 formed in the first contact opening 118A, the third contact opening 128A, the third contact opening 128B, and the fourth contact opening 136 of the first film stack 102. A first slit 267 and a second slit 269 may be formed on opposite sides of the device 200.

Figure 15B:
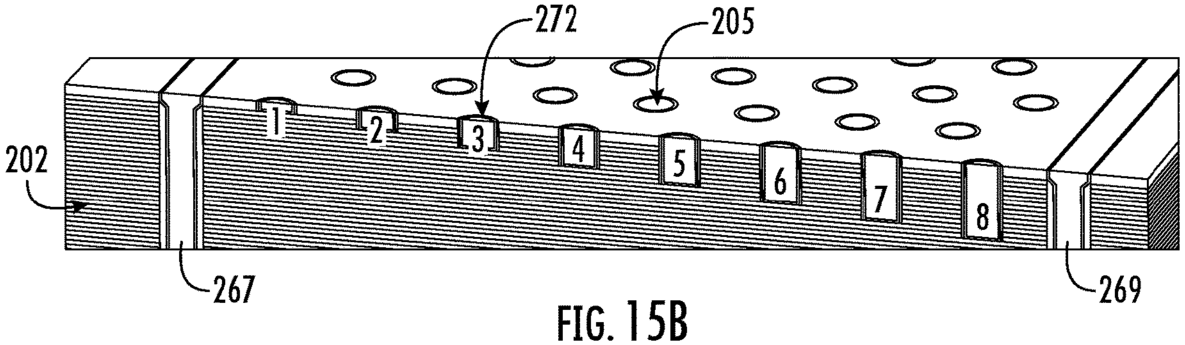
FIG. 15B illustrates a side cross-sectional view along cutline B-B' of the NAND device of FIG. 15A, according to embodiments of the present disclosure.
Figure 15C:
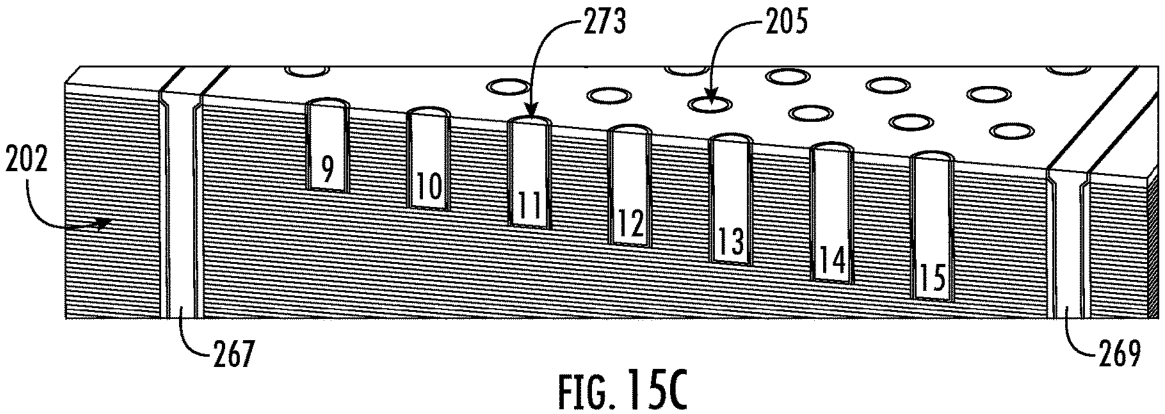
FIG. 15C illustrates a side cross-sectional view along cutline C-C' of the NAND device of FIG. 15A, according to embodiments of the present disclosure.
Figure 15D:
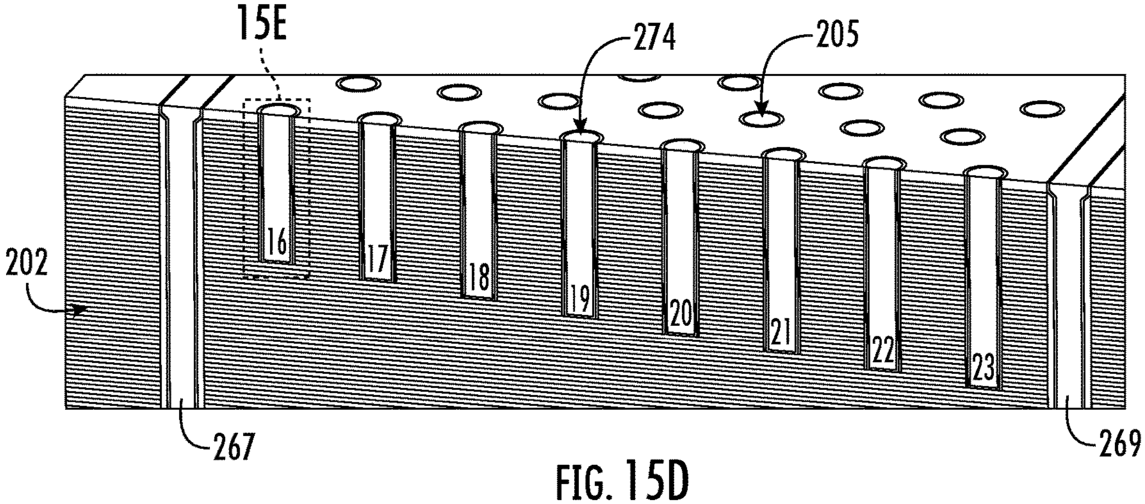
FIG. 15D illustrates a side cross-sectional view along cutline D-D' of the NAND device of FIG. 15A, according to embodiments of the present disclosure.

FIGS. 15B-15D illustrate side cross-sectional views of the device 200 of FIG. 15A along cutlines B-B', C-C', and D-D', respectively. As demonstrated, a depth of a first row 272 of the first plurality of wordline contacts 205 in the top tier increases between the first slit 267 and the second slit 269. Similarly, a depth of a second row 273 and a third row 274 of the first plurality of wordline contacts 205 in the top tier increases between the first and second slits 267, 269. As further shown, an average depth of first row 272, second row 273, and third row 274 of the first plurality of wordline contacts 205 increases towards the middle tier. However, each of the first plurality of contacts 205 may extend entirely to an upper surface 235 of the device 200, eliminating the need for a staircase arrangement for the device 200.

Figure 15E:
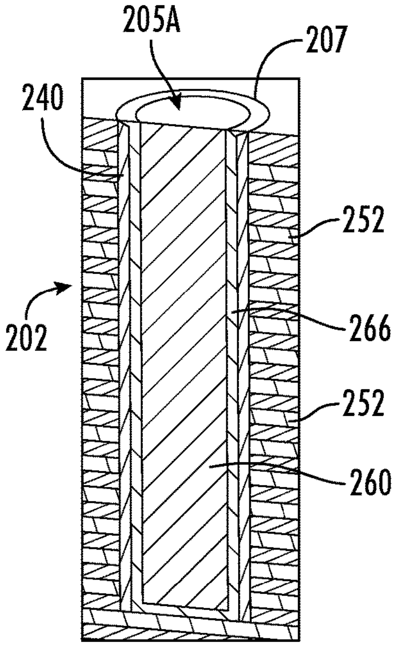
FIG. 15E illustrates a side cross-sectional view of a contact of the NAND device of FIG. 15A, according to embodiments of the present disclosure.

FIG. 15E shows a wordline contact 205A of the third row 274 of the first plurality of wordline contacts 205 in greater detail. The wordline contact 205A may be formed through a plurality of wordlines 252 of the film stack 202, wherein a liner 240 may be formed within contact opening 207. A contact liner 266 and a conductive material 260 may be deposited within the contact opening 207 to form the wordline contact 205A. In various embodiments, the conductive material 260 may be W, tungsten silicide (WSi), tungsten polysilicon (W/poly), tungsten alloy, tantalum (Ta), titanium (Ti), copper (Cu), ruthenium (Ru), nickel (Ni), cobalt (Co), chromium (Cr), iron (Fe), manganese (Mn), aluminum (Al), hafnium (Hf), vanadium (V), molybdenum (Mo), palladium (Pd), gold (Au), silver (Au), platinum (Pt), alloys thereof, or combinations thereof. Meanwhile, the contact liner 266 may be a metal nitride layer or metal silicon nitride layer, such as TiN, tantalum nitride (TaN), TaSiN, TiSiN and combinations thereof, among others.

Figure 16A:
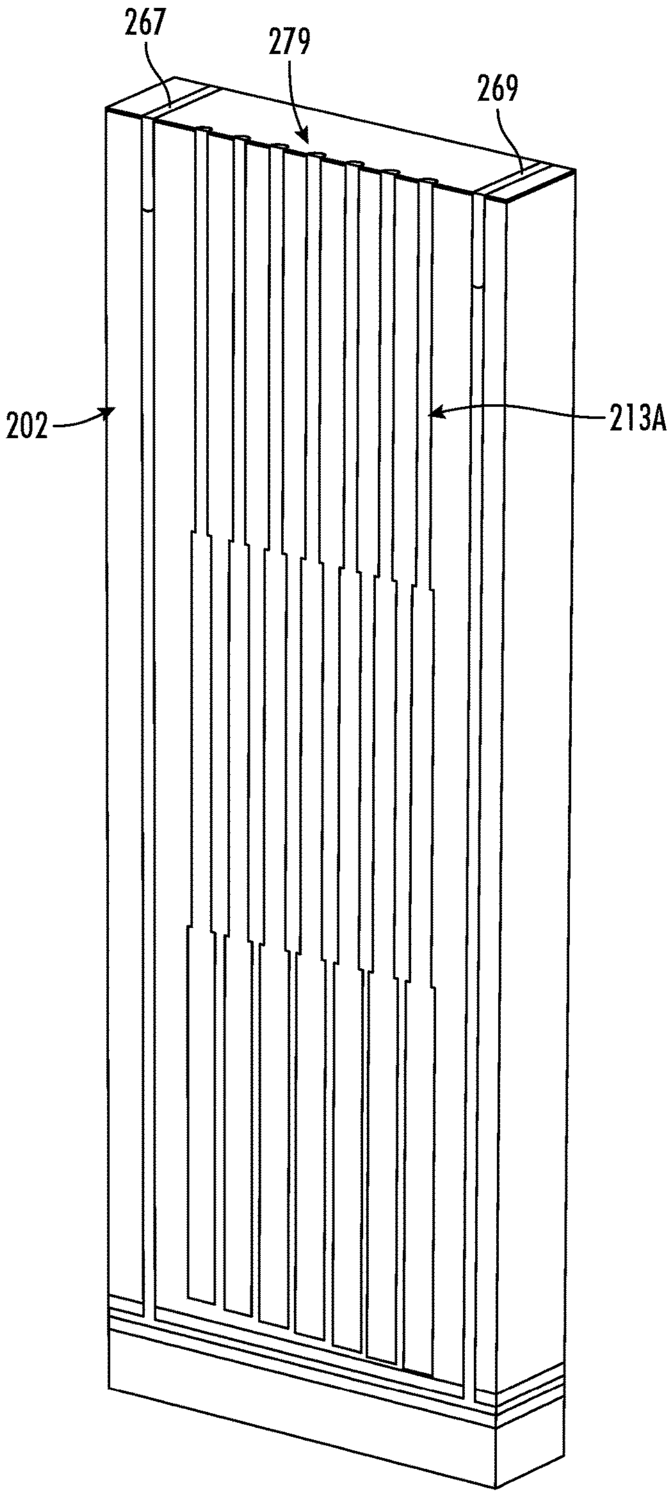
FIG. 16A illustrates a cross-sectional side perspective view along cutline E-E' of the NAND device, according to embodiments of the present disclosure.

FIG. 16A illustrates a side cross-sectional view of the device 200 of FIG. 15A along cutline E-E'. As demonstrated, a depth of each wordline contact 213A of a row 279 of the third plurality of wordline contacts 213 increases between the first slit 267 and the second slit 269. However, each wordline contact 213A of the row 279 extends to the upper surface 235 of the film stack 202.

Figure 16B:
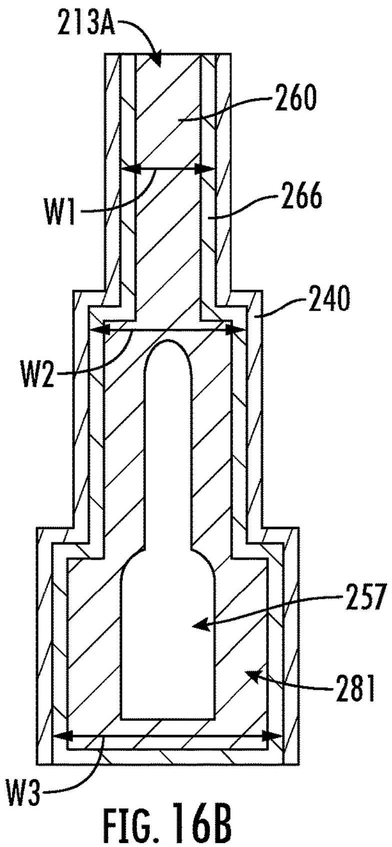
FIG. 16B illustrates a cross-sectional side view of a contact of the NAND device, according to embodiments of the present disclosure.
Figure 17A:
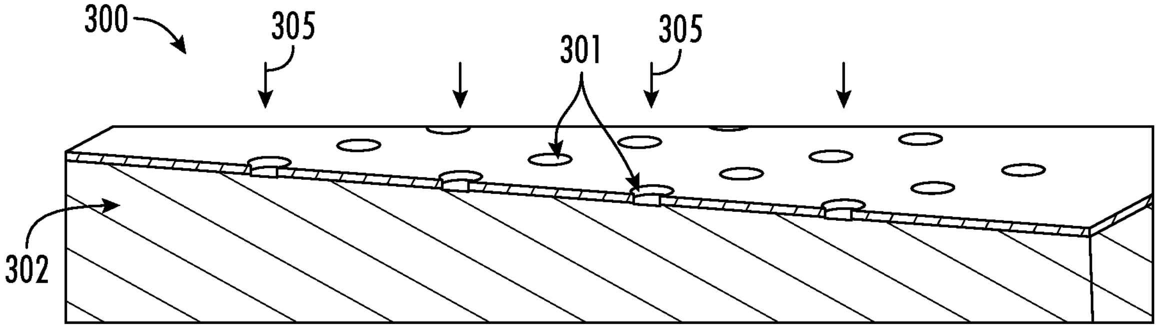
FIGS. 17A-17D illustrate side perspective views of an exemplary device during formation of a plurality of contact openings, according to embodiments of the present disclosure.
Figure 17B:
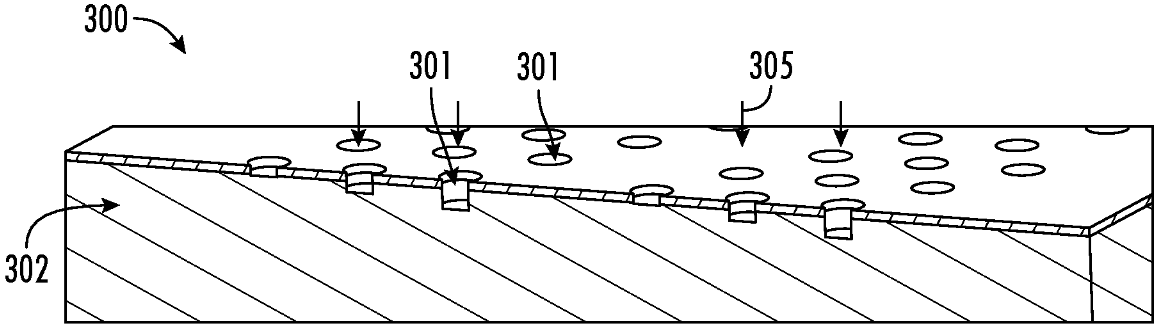
Figure 17C:
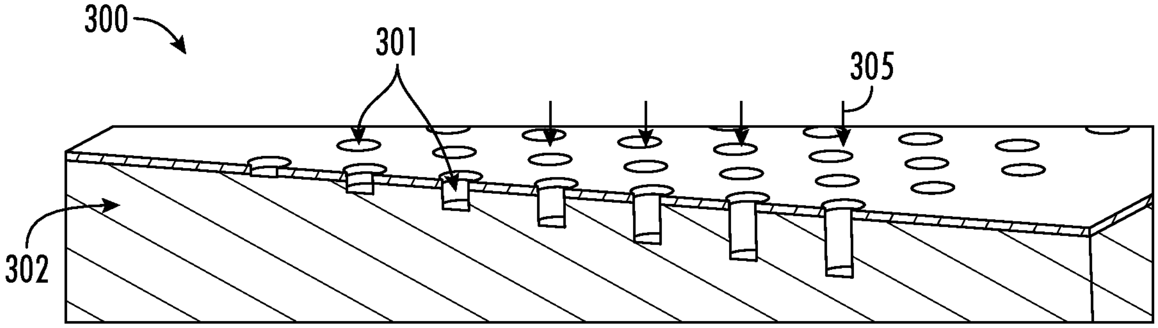
Figure 17D:
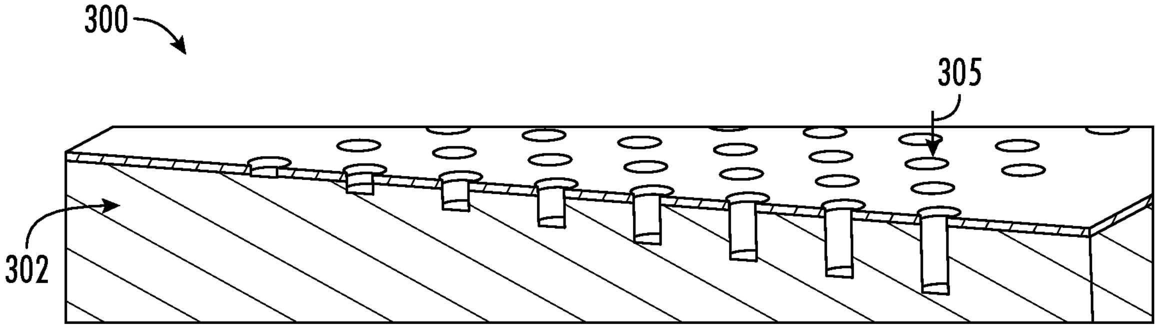

As better demonstrated in FIG. 16B, each wordline contact 213A may include liner 240 and contact liner 266 formed within a contact opening. As shown, the contact wordline contact 213A may have a first width 'W1', a second width 'W2', and a third width 'W3', wherein W1<W2<W3. Due to the tiered-width configuration of the wordline contact 213A, a void 257 may be present within a lower portion 281 of the conductive material 260.

FIGS. 17A-17D further demonstrate formation of a plurality of wordline contact openings 301 in a film stack 302 according to the approaches described herein. The plurality of contact openings 301 may be formed (e.g., etched 305) using the same or similar approaches used to form the wordline contact openings of devices 100 and/or 200. In the embodiment shown, a total of 360 ON pairs may be formed in the device 300, wherein 120 pairs per tier are present. For example, as shown in Table 1. below, seven (7) etch/lithography steps are used to form the 360 pairs across the three tiers.

| Litho/Etch | Etch down ON pairs | | |
|---|---|---|---|
| process step | Top tier | Middle tier | Bottom tier |
| 1 | 1 | 1 | 1 |
| 2 | 2 | 2 | 2 |
| 3 | 4 | 4 | 4 |
| 4 | 8 | 8 | 8 |
| 5 | 16 | 16 | 16 |
| 6 | 32 | 32 | 32 |
| 7 | 57 | 57 | 57 |

Figure 18:
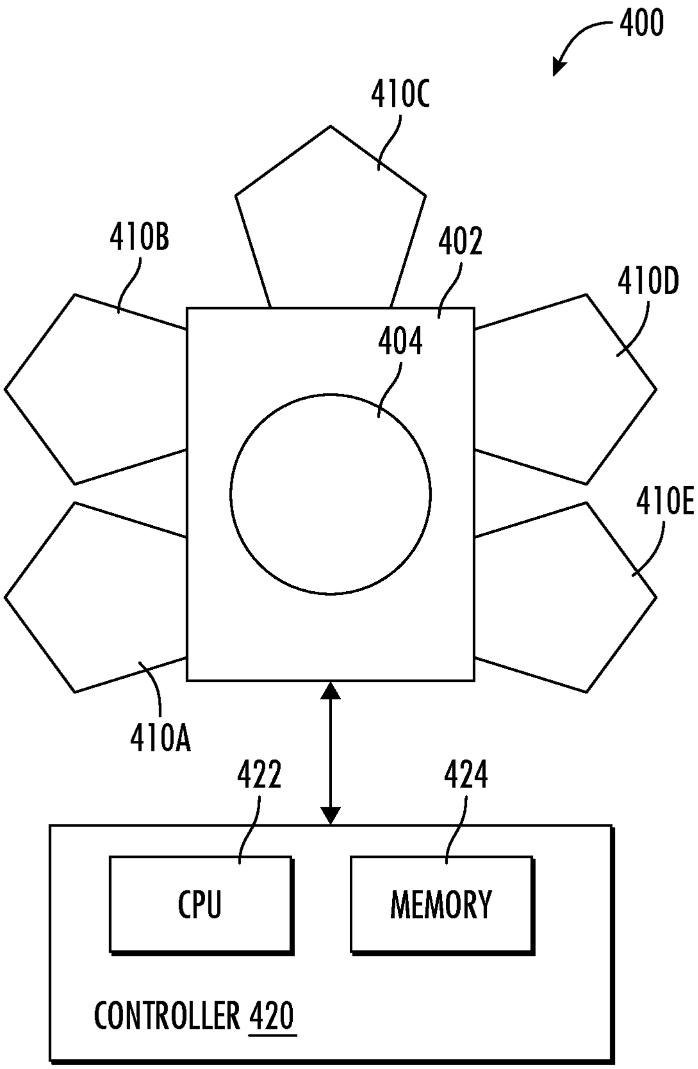
FIG. 18 is a schematic diagram of an example system according to embodiments of the present disclosure.

FIG. 18 shows a schematic of an example system/apparatus 400 according to embodiments of the disclosure. Operation of the system 400 will be described with reference to the device 100. In some embodiments, the system 400 may be a cluster tool operable to perform processes necessary to form the device 100 and the device 200 described herein. Although non-limiting, the system 400 may include at least one central transfer station/chamber 402 and one or more robots 404 within the transfer station/chamber 402, wherein the robot 404 is operable to move a robot blade and a wafer to and from each of a plurality of processing chambers 410A-410N connected with, or positioned adjacent to, the transfer station/chamber 402. In some embodiments, the system 400 may include any variety of suitable chambers including, but not limited to, a first deposition chamber 410A, a first etch chamber 410B, a second deposition chamber 410C, a second etch chamber 410D, and a third deposition chamber 410E. The first deposition chamber 410A, the second deposition chamber 410C, and the third deposition chamber 410E may include one or more of an atomic layer deposition chamber, a plasma enhanced atomic layer deposition chamber, a chemical vapor deposition chamber, a plasma enhanced chemical vapor deposition chamber, or a physical deposition. The particular arrangement of process chambers and components can be varied depending on the cluster tool, and should not be taken as limiting the scope of the disclosure. For example, in alternative embodiments, only a single deposition chamber and/ or only a single etch chamber is present in the system 400. In another example, one or more of the deposition chambers may include multiple process regions within a same chamber, which permits a common supply of gases, common pressure control, and common process gas exhaust/pumping. Modular design of the system enables rapid conversion from one configuration to any other.

In some embodiments, the first deposition chamber 410A may be used to deposit the first film stack 102 as alternating first layers 106A-106E and second layers 108A-108D, and to deposit the second film stack 103 as alternating first layers 113A-113D and second layers 111A-111D. The first deposition chamber 410A may be further used to deposit the plurality of masking layers (e.g., the first masking layer 110, the second masking layer 124, and the third masking layer 132) over the first film stack 102.

The first etch chamber 410B may be used to etch the plurality of masking layers and to form the plurality of contact openings (e.g., the first contact opening 118A, the third contact opening 128A, the third contact opening 128B, and the fourth contact opening 136). The first etch chamber 410B may be further used to form the first plurality of contact openings in the first film stack 102 and the second plurality of contact openings in the second film stack 103. The first etch chamber 410B may be further used to punch through the liner 140 along the bottom 149 of each contact opening of the first and second plurality of contact openings.

The second deposition chamber 410C may be used to deposit the liner 140 over the device 100, including within each contact opening of the first and second plurality of contact openings, and to deposit the sacrificial gapfill 127 within the first plurality of contact openings.

The second etch chamber 410D may be used to remove the first layers 106A-106E and the first layers 113A-113D to form the plurality of wordline openings 150 in the first and second film stacks 102, 103. In some embodiments, a wet etch process may be performed in the second etch chamber 410D.

The third deposition chamber 410E may be used to form the plurality of wordlines 152 by depositing the first conductive material 154 within the plurality of wordline openings 150. The third deposition chamber 410E (or another deposition chamber) may be further used to deposit the second conductive material 160 within the first and second plurality of contact openings to form the plurality of wordline contacts 162 within the device 100.

A system controller 420 is in communication with the robot 404, the transfer station/chamber 402, and the plurality of processing chambers 410A-410E. The system controller 420 can be any suitable component that can control the processing chambers 410A-410E and robot(s) 404, as well as the processes occurring within the process chambers 410A-410E. For example, the system controller 420 can be a computer including a central processing unit 422, memory 424, suitable circuits/logic/instructions, and storage.

Processes or instructions may generally be stored in the memory 424 of the system controller 420 as a software routine that, when executed by the processor 422, causes the processing chambers 410A-410N to perform processes of the present disclosure. The software routine may also be stored and/or executed by a second processor (not shown) that is remotely located from the hardware being controlled by the processor 422. Some or all of the method(s) of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor 422, transforms the general purpose computer into a specific purpose computer (controller) that controls the chamber operation such that the processes are performed.

Figure 19:
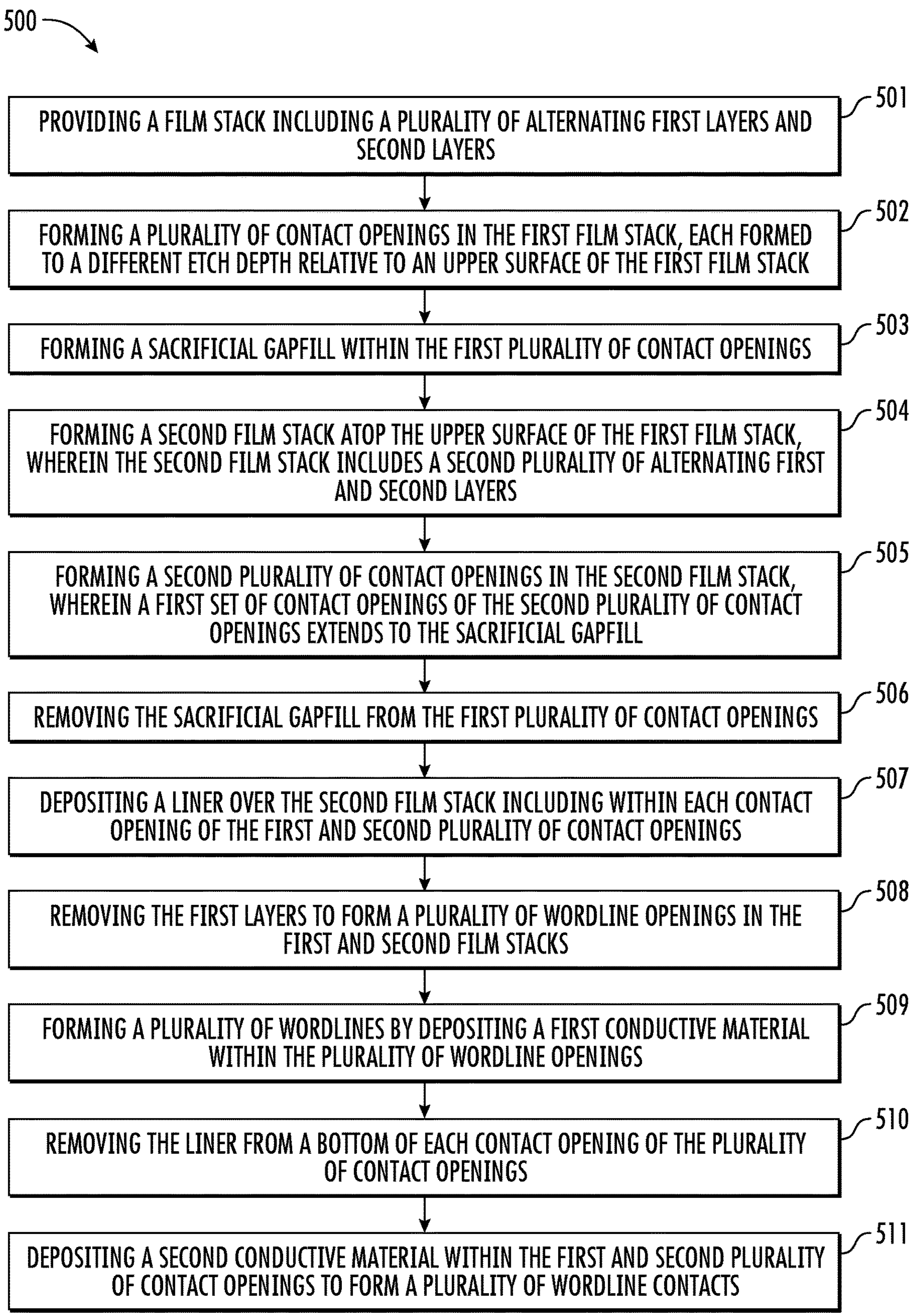
FIG. 19 depicts a process flow of a method for forming the exemplary device, according to embodiments of the present disclosure.

Turning now to FIG. 19, a process 500 according to embodiments of the present disclosure is shown. At block 501, the process 500 may include providing a first film stack including a plurality of alternating first layers and second layers. In some embodiments, the first layers of the plurality of alternating first layers and second layers are a dielectric material, and the second layers of the plurality of alternating first layers and second layers are a dielectric material or a conductive material. In some embodiments, the first layers of the plurality of alternating first layers and second layers are silicon oxide, and the second layers of the plurality of alternating first layers and second layers are silicon nitride.

At block 502, the process 500 may include forming a plurality of contact openings in the first film stack, wherein each contact opening of the plurality of contact openings is formed to a different etch depth relative to an upper surface of the film stack. In some embodiments, forming the plurality of contact openings in the film stack may include patterning a first set of openings through a first masking layer, and etching, through the first set of openings, a first set of contact openings of the plurality of contact openings. Forming the plurality of contact openings in the film stack may further include patterning a second set of openings through a second masking layer, wherein one opening of the second set of openings is aligned with one contact opening of the first set of contact openings, and etching, through the second set of openings, a second set of contact openings of the plurality of contact openings. Forming the plurality of contact openings in the film stack may further include patterning a third set of openings through a third masking layer, wherein the third masking layer is formed over the first and second sets of contact openings, and etching, through the third set of openings, a third set of contact openings of the plurality of contact openings. In some embodiments, a first depth of the first set of contact openings is less than a second depth of the second set of contact openings, which is less than a third depth of the third set of contact openings.

At block 503, the process 500 may include forming a sacrificial gapfill within the first plurality of contact openings. In some embodiments, the sacrificial gapfill may be deposited and then planarized.

At block 504, the process 500 may include forming a second film stack atop the upper surface of the first film stack, wherein the second film stack includes a second plurality of alternating first and layers and second layers.

At block 505, the process 500 may further include forming a second plurality of contact openings in the second film stack, wherein a first set of contact openings of the second plurality of contact openings extends to the sacrificial gapfill.

At block 506, the process 500 may further include removing the sacrificial gapfill from the first plurality of contact openings. In some embodiments, the sacrificial gapfill may be etched.

At block 507, the process 500 may include depositing a liner over the second film stack including within each contact opening of the first and second plurality of contact openings.

At block 508, the process 500 may include removing the first layers to form a plurality of wordline openings in the first and second film stacks. In some embodiments, the wordline openings are formed using a lateral wet etch process.

At block 509, the process 500 may include forming a plurality of wordlines by depositing a first conductive material within the plurality of wordline openings. In some embodiments, the first conductive material is W or Mo.

At block 510, the process 500 may include removing the liner from a bottom of each contact opening of the plurality of contact openings. In some embodiments, removing the liner from the bottom of each contact opening of the first and second plurality of contact openings exposes an upper surface of one or more of the plurality of wordlines. In some embodiments, the liner is removed from the bottom of each contact opening of the first and second plurality of contact openings without removing the liner from a sidewall of each contact opening of the first and second plurality of contact openings.

At block 511, the process 500 may include depositing a second conductive material within the first and second plurality of contact openings to form a plurality of wordline contacts. In some embodiments, the second conductive material may be W, which is deposited together with TiN, atop an upper surface of the plurality of wordlines.

In various embodiments, design tools can be provided and configured to create the datasets used to pattern the semiconductor layers of the device, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

For the sake of convenience and clarity, terms such as "top," "bottom," "upper," "lower," "vertical," "horizontal," "lateral," and "longitudinal" will be used herein to describe the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:

providing a first film stack comprising a first plurality of alternating first layers and second layers;

forming a first plurality of contact openings in the first film stack, wherein each contact opening of the first plurality of contact openings is formed to a different vertical etch depth relative to a plane defined by an uppermost horizontal surface of the first film stack;

forming a sacrificial gapfill within the first plurality of contact openings;

forming a second film stack atop the uppermost horizontal surface of the first film stack, wherein the second film stack comprises a second plurality of alternating first layers and second layers;

forming a second plurality of contact openings in the second film stack, wherein a first set of contact openings of the second plurality of contact openings extends to the sacrificial gapfill; and removing the sacrificial gapfill from the first plurality of contact openings.

2. The method of claim 1, further comprising:

depositing a liner over the second film stack including within each contact opening of the first and second plurality of contact openings;

removing the first layers to form a plurality of wordline openings in the first and second film stacks;

forming a plurality of wordlines by depositing a first conductive material within the plurality of wordline openings;

removing the liner from a bottom of the first and second plurality of contact openings; and depositing a second conductive material within the first and second plurality of contact openings to form a plurality of wordline contacts.

3. The method of claim 2, wherein the liner is removed from the bottom of the first and second plurality of contact openings without removing the liner from a sidewall of each contact opening of the first and second plurality of contact openings.

4. The method of claim 2, wherein forming the second plurality of contact openings comprises:

etching the first set of contact openings through the second film stack to expose an upper surface of the sacrificial gapfill; and forming a second set of contact openings adjacent the first set of contact openings, wherein each of the second set of contact openings is formed to a different etch depth relative to an upper surface of the second film stack.

5. The method of claim 2, wherein depositing the second conductive material within the first and second plurality of contact openings to form the plurality of wordline contacts comprises depositing tungsten within the first and second plurality of contact openings, and wherein each of the plurality of wordline contacts extends to the upper surface of the second film stack.

6. The method of claim 1, wherein forming the plurality of contact openings in the first film stack comprises:

patterning a first set of openings through a first masking layer;

etching, through the first set of openings, a first set of contact openings of the first plurality of contact openings;

patterning a second set of openings through a second masking layer, wherein one opening of the second set of openings is aligned with one contact opening of the first set of contact openings;

etching, through the second set of openings, a second set of contact openings of the first plurality of contact openings;

patterning a third set of openings through a third masking layer, wherein the third masking layer is formed over the first and second sets of contact openings; and etching, through the third set of openings, a third set of contact openings of the first plurality of contact openings.

7. The method of claim 6, wherein a first depth of the first set of contact openings is less than a second depth of the second set of contact openings, and wherein the second depth of the second set of contact openings is less than a third depth of the third set of contact openings.

8. The method of claim 1, wherein the first layers of the first and second plurality of alternating first layers and second layers are silicon oxide, and wherein the second layers of the first and second plurality of alternating first layers and second layers are silicon nitride.

9. The method of claim 1, wherein each contact opening of the first plurality of contact openings in the first film stack has a first diameter, wherein each contact opening of the second plurality of contact openings in the second film stack has a second diameter, and wherein the first diameter is greater than the second diameter.

10. A system, comprising:

a processor;

a memory storing instructions executable by the processor to:

provide a first film stack comprising a first plurality of alternating first layers and second layers;

form a first plurality of contact openings in the first film stack, wherein each contact opening of the first plurality of contact openings is formed to a different etch depth relative to a plane defined by an uppermost surface of the first film stack;

form a sacrificial gapfill within the first plurality of contact openings;

form a second film stack atop the uppermost horizontal surface of the first film stack, wherein the second film stack comprises a second plurality of alternating first layers and second layers;

form a second plurality of contact openings in the second film stack, wherein a first set of contact openings of the second plurality of contact openings extends to the sacrificial gapfill; and remove the sacrificial gapfill from the first plurality of contact openings.

11. The system of claim 10, further comprising instructions executable by the processor to:

deposit a liner over the second film stack, including within each contact opening of the first and second plurality of contact openings;

remove the first layers to form a plurality of wordline openings in the first and second film stacks;

form a plurality of wordlines by depositing a first conductive material within the plurality of wordline openings;

remove the liner from a bottom of the first and second plurality of contact openings; and deposit a second conductive material within the first and second plurality of contact openings to form a plurality of wordline contacts.

12. The system of claim 11, wherein the liner is removed from the bottom of the first and second plurality of contact openings without removing the liner from a sidewall of each contact opening of the first and second plurality of contact openings.

13. The system of claim 10, the instructions executable by the processor to form the plurality of contact openings in the first film stack further comprises instructions to:

pattern a first set of openings through a first masking layer;

etch, through the first set of openings, a first set of contact openings of the first plurality of contact openings;

pattern a second set of openings through a second masking layer, wherein one opening of the second set of openings is aligned with one contact opening of the first set of contact openings;

etch, through the second set of openings, a second set of contact openings of the first plurality of contact openings;

pattern a third set of openings through a third masking layer, wherein the third masking layer is formed over the first and second sets of contact openings; and etch, through the third set of openings, a third set of contact openings of the first plurality of contact openings.

14. The system of claim 13, wherein a first depth of the first set of contact openings is less than a second depth of the second set of contact openings, and wherein the second depth of the second set of contact openings is less than a third depth of the third set of contact openings.

15. The system of claim 10, wherein each contact opening of the first plurality of contact openings in the first film stack has a first diameter, wherein each contact opening of the second plurality of contact openings in the second film stack has a second diameter, and wherein the first diameter is greater than the second diameter.

16. The system according to claim 10, wherein the instructions executable by the processor to form the second plurality of contact openings further comprises instructions to:

etch the first set of contact openings through the second film stack to expose an upper surface of the sacrificial gapfill; and form a second set of contact openings adjacent the first set of contact openings, wherein each of the second set of contact openings is formed to a different etch depth relative to an upper surface of the second film stack.

* * * * *